(12) United States Patent
Fang et al.

(10) Patent No.: US 11,193,972 B2
(45) Date of Patent: Dec. 7, 2021

(54) INSPECTION EQUIPMENT FOR AN OVER THE AIR TESTING PROCESS AND TESTING DEVICE THEREOF

(71) Applicant: Siliconware Precision Industries Co., Ltd., Taichung (TW)

(72) Inventors: Bo-Siang Fang, Taichung (TW); Kuan-Ta Chen, Taichung (TW); Hsinjou Lin, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 25 days.

(21) Appl. No.: 16/734,692

(22) Filed: Jan. 6, 2020

(65) Prior Publication Data

US 2021/0072307 A1 Mar. 11, 2021

(30) Foreign Application Priority Data

Sep. 10, 2019 (CN) .................................. 108132583

(51) Int. Cl.
  *G01R 31/28* (2006.01)
(52) U.S. Cl.
  CPC ..... *G01R 31/2887* (2013.01); *G01R 31/2896* (2013.01)
(58) Field of Classification Search
  CPC ............... G01R 31/2896; G01R 1/045; G01R 31/2863; G01R 31/2875; G01R 31/2877; G01R 1/0425; G01R 1/06722; G01R 1/0673; G01R 1/06755; G01R 1/07307; G01R 29/10; G01R 31/2601; G01R 31/2822; G01R 31/2844; G01R 31/2867; G01R 31/2879; G01R 31/2886; G01R 31/31705; G01R 31/31723; G01R 31/3177; G01R 3/00; G01R 31/2891; G01R 31/002; G01R 31/3025; G01R 31/31716; H01Q 1/2283; H01Q 1/02; H01Q 1/526; H01Q 23/00; H01R 12/716; H01R 12/722; H01R 13/629; H01R 13/6473; H01R 13/6585; H01R 13/6591; H01R 2201/06; H01R 24/60; H01R 33/945; H01R 12/7082; H01R 12/714; H01R 13/2435; H01R 43/205; H04B 17/17; H04B 1/005; H04B 1/036; H04B 1/3827; H04B 1/3888; H05K 3/4697; H05K 3/4644; H05K 2201/10098; H05K 2201/10545; H05K 2201/0723;
  (Continued)

(56) References Cited

U.S. PATENT DOCUMENTS 5,772,451 A * 6/1998 Dozier, II ........... H01L 21/4889
  439/70
5,800,184 A * 9/1998 Lopergolo ........... H05K 7/1069
  439/591

(Continued)

*Primary Examiner* — Vinh P Nguyen
(74) *Attorney, Agent, or Firm* — Kelly & Kelley, LLP

(57) ABSTRACT

An inspection equipment is used for inspecting an antenna, and includes a testing device having a first circuit structure, a carrier, a supporting part and a second circuit structure detachably stacked on one another sequentially. Therefore, the carrier, the first circuit structure, the second circuit structure or the supporting part can be detached when different devices under test are inspected, without replacing the whole testing device, thereby achieving effects of modular replacing and cost saving.

18 Claims, 4 Drawing Sheets

(58) Field of Classification Search
CPC .... H05K 1/183; H05K 1/0243; H05K 1/0222; H05K 1/0218
See application file for complete search history.

(56) References Cited

U.S. PATENT DOCUMENTS

| | | | | |
|---|---|---|---|---|
| 6,730,134 | B2* | 5/2004 | Neidich | H01R 13/2435 |
| | | | | 29/25.01 |
| 7,396,236 | B2* | 7/2008 | Eldridge | G01R 1/07307 |
| | | | | 324/750.05 |
| 10,680,727 | B2* | 6/2020 | Lu | H04B 17/16 |
| 10,852,349 | B2* | 12/2020 | Liu | G01R 31/2822 |
| 2016/0025788 | A1* | 1/2016 | Fujita | G01R 31/2822 |
| | | | | 343/703 |
| 2021/0033668 | A1* | 2/2021 | Trotta | G01R 1/0425 |

* cited by examiner

INSPECTION EQUIPMENT FOR AN OVER THE AIR TESTING PROCESS AND TESTING DEVICE THEREOF

RELATED APPLICATIONS

This application claims priority to Taiwanese Application Serial No. 108132583, filed on Sep. 10, 2019. The entirety of the application is hereby incorporated by reference herein and made a part of this specification.

BACKGROUND OF THE INVENTION

1. Technical Field

The present disclosure relates to an inspection equipment, and, more particularly, to an inspection equipment used in an over the air testing process and a testing device of the inspection equipment.

2. Description of the Prior Art

Current communication transmission is in fourth generation (4G), and is under development toward fifth generation (5G), which provides greater wireless transmission bandwidth, from 28 GHz to 52.6 GHz (3gpp R15), even to as high as 73 GHz.

Compared to the current 4G antenna testing, which is conducted at a system end (such as mobile phones, tablet personal computers etc.), the 5G antenna testing has to be conducted at a packaging end, since the mmWave band has been changed to Antenna in Package (AiP) packaging design.

As shown in FIG. 1, an inspection equipment 1 for testing an antenna according to the prior art comprises a chamber 10 having an opening 100, a cover 11 covering the opening 100 and having a passing hole 110, a socket 13 disposed on the cover 11, and a handler 12 connected to the socket 13. When the antenna is tested over the air (OTA), a device under test 9 is disposed and compressed on the socket 13 by the handler 12, and an antenna structure 90 of the device under test 9 is oriented toward a metal functioning board 10a and is exposed completely, without being shielded by anything.

When the inspection equipment 1 is conducting the testing process, the handler 12 has to be replaced in order to test the antenna structure 90 (of different sizes) of different semiconductor packages (e.g., QFN, LGA, SiP, FCBGA, FCCSP etc.). Therefore, the handler 12 has to be customized for each of the semiconductor packages, and the inspection equipment 1 thus has a cost significantly increased.

Therefore, how to design an inspection equipment that is applicable to an OTA testing environment, meets the antenna testing requirement, and does not need a customized handler is becoming an urgent issue in the art.

SUMMARY OF THE INVENTION

In view of the drawbacks of the prior art, the present disclosure provides a testing device, which comprises: a carrier having a first side and a second side opposing the first side; a conductive element disposed in the carrier and being in communication with the first side and the second side; a first circuit structure detachably disposed on the first side of the carrier and electrically connected to the conductive element; a supporting part loosely fitted to the second side of the carrier; and a second circuit structure detachably disposed on the supporting part and electrically connected to the conductive element.

In an embodiment, the carrier has a groove on the second side. In another embodiment, the carrier has a functioning hole on the first side and in communication with the groove. In yet another embodiment, the first circuit structure has a through hole corresponding to the functioning hole.

In an embodiment, the carrier is made of a non-metal material.

In an embodiment, the conductive element has a probe structure.

In an embodiment, the conductive element passes through the supporting part and is electrically connected to the second circuit structure.

In an embodiment, the first circuit structure is screwed with the carrier.

In an embodiment, the second circuit structure is screwed with the supporting part.

In an embodiment, the supporting part is engaged with the carrier.

In an embodiment, the supporting part has a conductor electrically connected to the second circuit structure. In another embodiment, the conductor has a probe structure.

In an embodiment, the supporting part is made of a non-metal material.

In an embodiment, the testing device further comprises an electrical connector disposed on the first circuit structure and electrically connected to the first circuit structure.

The present disclosure further provides inspection equipment, which comprises: a chamber having an opening; a cover covering the opening of the chamber; the above-described testing device disposed on the cover via the first circuit structure; and an handler disposed on the second circuit structure of the testing device.

In an embodiment, the first circuit structure is detachably disposed on the cover.

In an embodiment, the handler is detachably disposed on the second circuit structure.

In an embodiment, the cover has a passing hole, from which the carrier is exposed.

In an embodiment, the inspection equipment further comprises a displacement device fixed to the handler. In another embodiment, the displacement device comprises at least one robotic arm.

In an embodiment, the chamber comprises a metal material.

In the inspection equipment according to the present disclosure, the testing device has a detachable design and comprises detachable boards, i.e., the carrier, the first circuit structure, the second circuit structure and the supporting part. When different devices under test are tested, only one or some of the carrier, the first circuit structure, the second circuit structure and the supporting part are required to be changed, without replacing the whole testing device, thereby achieving the effect of modular replacing and cost saving. Compared with the prior art, the inspection equipment according to the present disclosure can be used to test different devices under test with a single aspect of a handler, without customizing the handler, thereby reducing the cost of the inspection equipment.

DETAILED DESCRIPTION OF THE PREFERRED EMBODIMENTS

Figure 1:
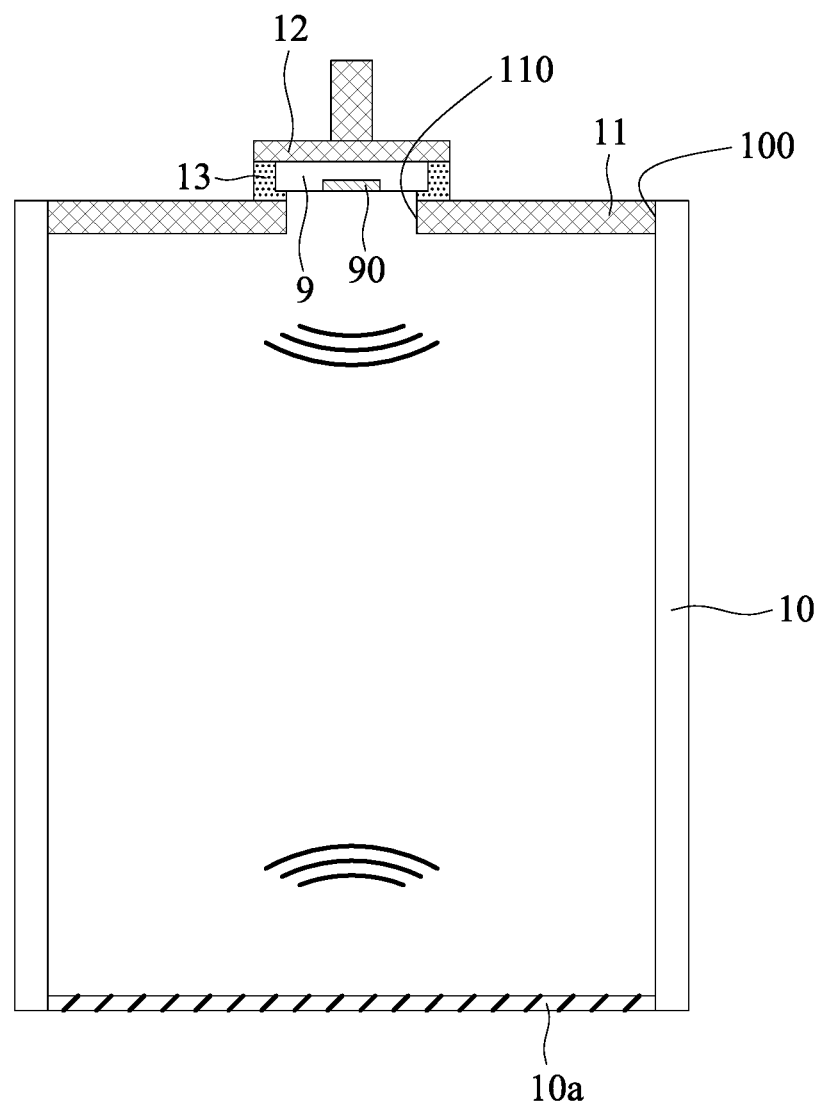
FIG. 1 is a side view of an inspection equipment according to the prior art.

The following illustrative embodiments are provided to illustrate the disclosure of the present disclosure, these and other advantages and effects can be apparently understood by those in the art after reading the disclosure of this specification.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "over," "first," "second," "one," and the like, are for illustrative purposes only, and are not meant to limit the range implementable by the present disclosure. Any changes or adjustments made to their relative relationships, without modifying the substantial technical contents, are also to be construed as within the range implementable by the present disclosure.

Figure 2:
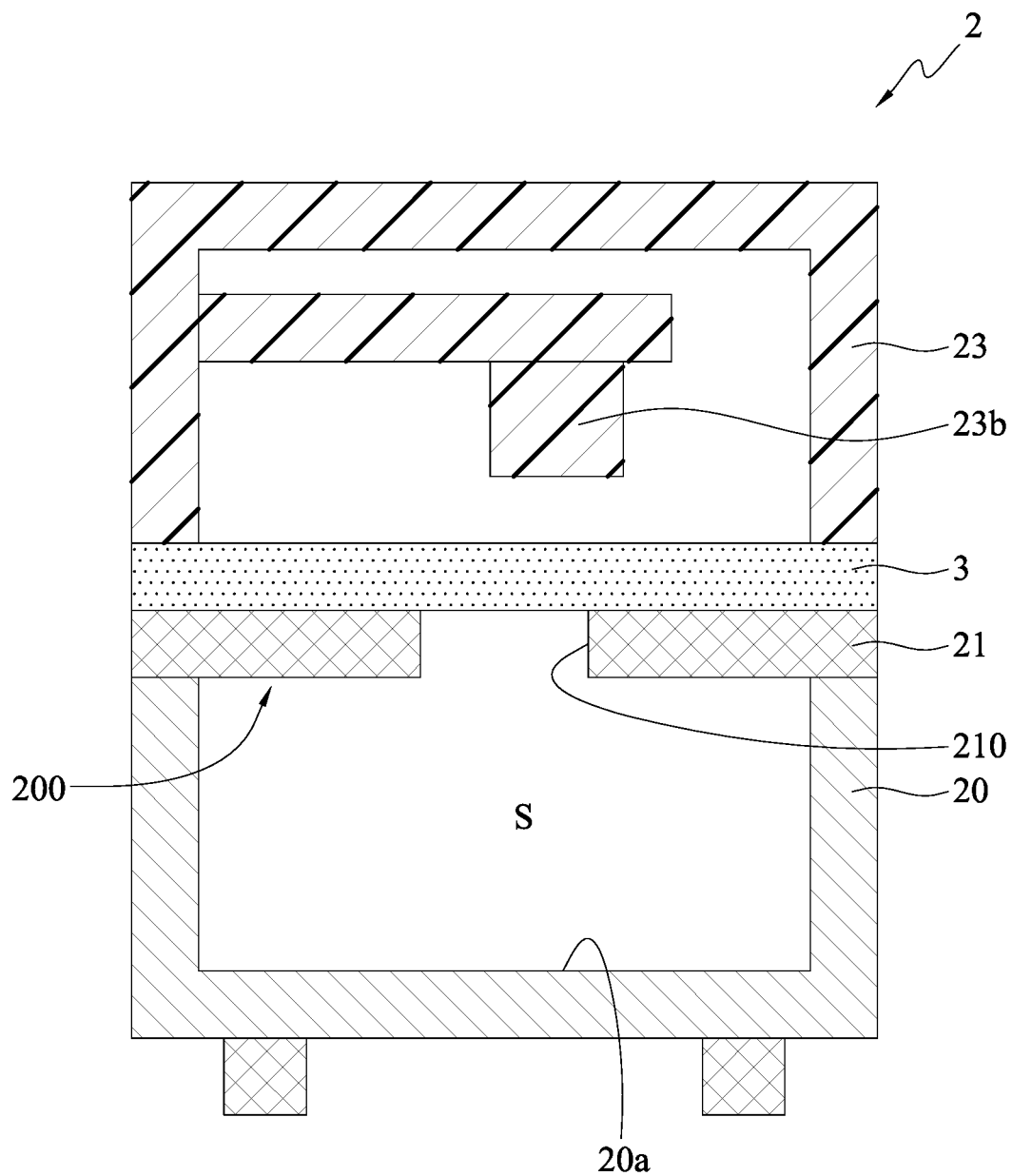
FIG. 2 is a side view of an inspection equipment according to the present disclosure.
Figure 3:
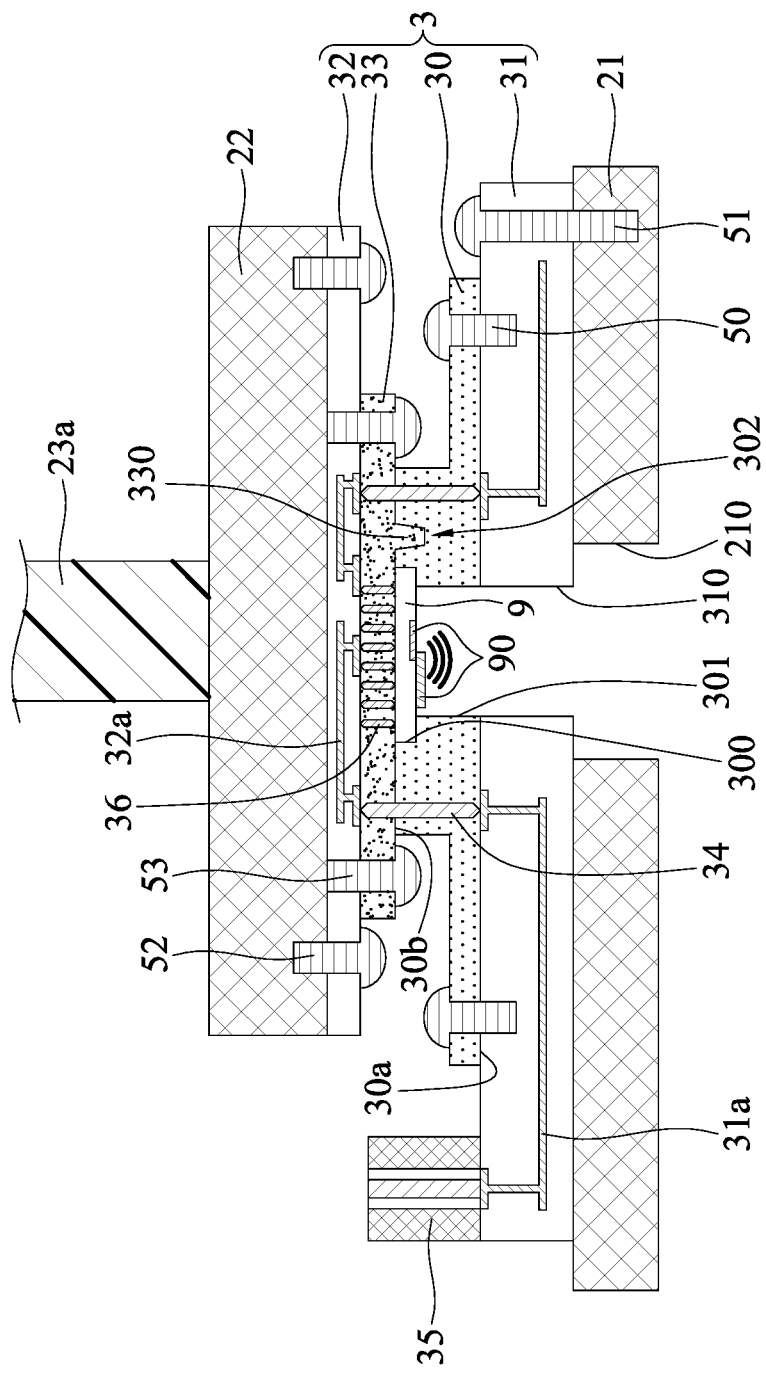
FIG. 3 is a side view of a portion of an inspection equipment in use according to the present disclosure.
Figure 4:
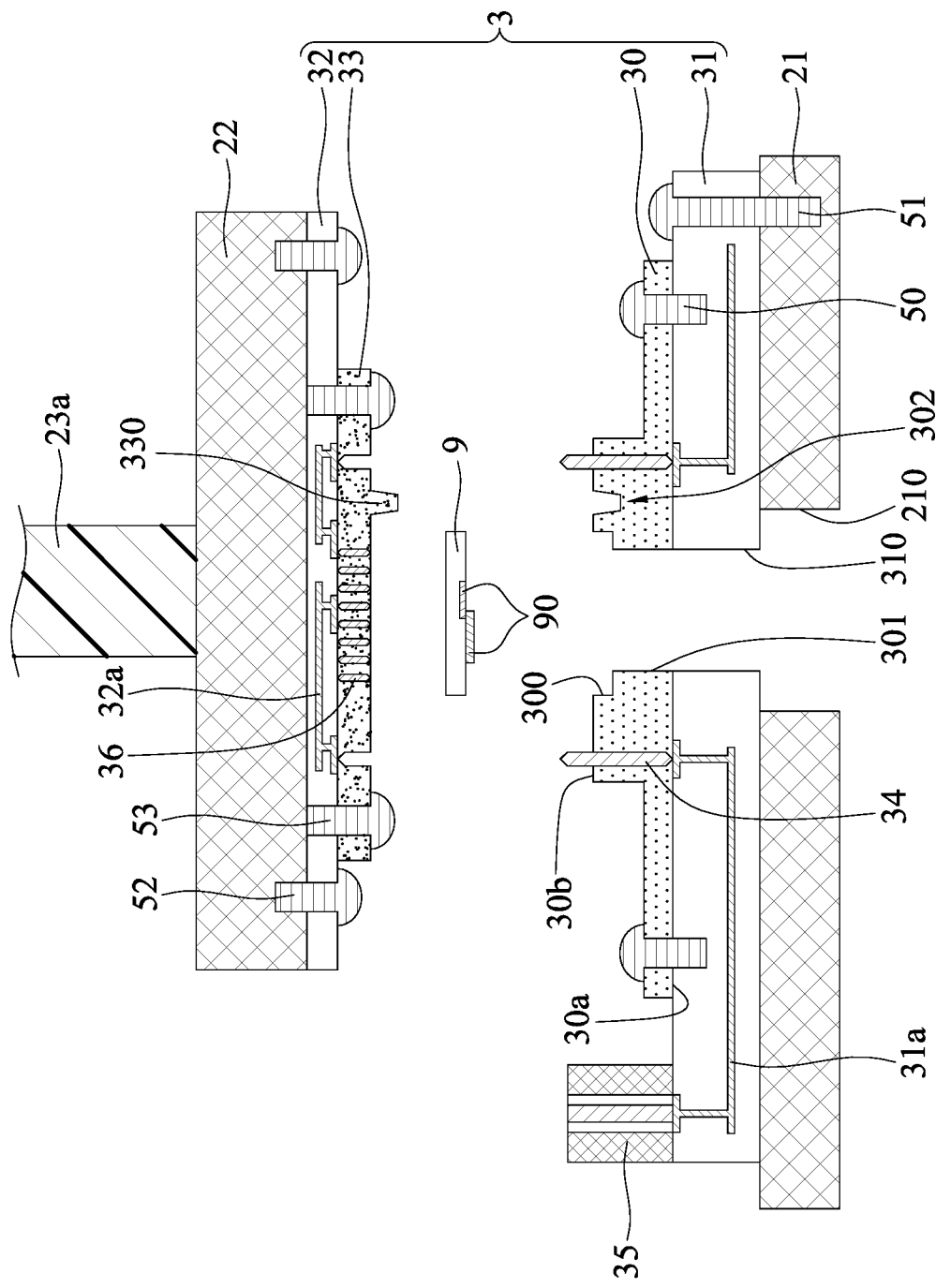
FIG. 4 is a side view of a portion of an inspection equipment before use according to the present disclosure.

FIGS. 2 to 4 are schematic diagrams of an inspection equipment 2 according to the present disclosure. In an embodiment, the inspection equipment 2 tests the operation of an antenna.

As shown in FIGS. 2 to 4, the inspection equipment 2 comprises a chamber 20 having an opening 200, a cover 21 covering the opening 200, a testing device 3 disposed on the cover 21, a handler 22 connected to the testing device 3, and a displacement device 23 connected to the handler 22.

In an embodiment, the chamber 20 has a receiving space S in communication with the opening 200, and an inner wall surface that is an active surface 20a (in an embodiment, a bottom surface is used as the active surface). The opening 200 is formed opposite to the active surface 20a. In an embodiment, the chamber 20 is in the form of over the air (OTA), and comprises a wall surface made of a metal material, a wave absorbing material disposed in the wall surface, and an antenna element (not shown) or a metal reflector (not shown), such as a metal board, disposed on the active surface 20a in the receiving space S of the chamber 20.

The cover 21 includes a passing hole 210 in communication with the receiving space S. In an embodiment, the cover 21 is a metal carrying board configured for carrying the testing device 3.

The displacement device 23 includes at least one robotic arm. In an embodiment, the displacement device 23 comprises a plurality of robotic arms 23a and 23b, the robotic arm 23a (as shown in FIG. 3) is provided with the handler 22 at an end thereof, and the robotic arm 23b has a sucking disc (not shown) at an end thereof configured for picking and placing a device under test (DUT) 9 shown in FIG. 3. In an embodiment, the device under test 9 is an electronic package having an antenna structure 90 and a semiconductor chip having an mm Wave function. The device under test 9 can be in any type, and can be removed in any manner, such as by hands.

The testing device 3 is a socket, and comprises a carrier 30, a first circuit structure 31, a second circuit structure 32 and a supporting part 33, as shown in FIG. 3.

The carrier 30 has a first side 30a and a second side 30b opposing the first side 30a. A conductive element 34 is disposed in the carrier 30 and is in communication with the first side 30a and the second side 30b. The second side 30b is used for carrying the device under test 9.

In an embodiment, the carrier 30 is a board made of a non-metal dielectric material, such as Teflon or an equivalent material that has a low Df and a low Dk, to avoid interfering electromagnetic waves (i.e., antenna radiation signals).

A groove 300 is formed on the second side 30b of the carrier 30 for the device under test 9 to be placed therein and positions the device under test 9 onto the carrier 30.

A functioning hole 301 is formed on the first side 30a of the carrier 30, is in communication with the groove 300, and corresponds in position to the passing hole 210 of the cover 21. The device under test 9 is exposed from the functioning hole 301 and the passing hole 210, and the antenna structure 90 of the device under test 9 is not shielded.

The conductive element 34 has a probe structure, such as a pogo pin, a bullet, a dual-head probe etc., and can move elastically toward the first side 30a or the second side 30b with respect to the carrier 30. In an embodiment, the conductive element 34 elastically passes through the carrier 30, with one end of the conductive element 34 in contact with a circuit layer 31a of the first circuit structure 31 and the other end in contact with a circuit layer 32a of the second circuit structure 32, and is electrically connected to the first and second circuit structures 31 and 32.

The first circuit structure 31 is detachably disposed on the first side 30a of the carrier 30 and detachably disposed on the cover 21.

In an embodiment, the first circuit structure 31 is a circuit board, such as a substrate having a core layer or a coreless substrate, and comprises a dielectric material and at least one circuit layer 31a bonded to the dielectric material, such as a fan out redistribution layer (RDL). In another embodiment, the first circuit structure 31 is a lead frame.

The first circuit structure 31 comprises a through hole 310 corresponding to the functioning hole 301. The device under test 9 is also exposed from through hole 310.

The first circuit structure 31 is screwed (e.g., via screws 50 and 51 made of metal or an insulation material) onto the carrier 30 and the cover 21.

The testing device 3 comprises at least one electrical connector 35, such as a connector or a junction, disposed on the first circuit structure 31 and electrically connected to the first circuit structure, and an external electronic device (not shown) can be connected to the electrical connector 35. In an embodiment, the electrical connector 35 is a coaxial junction, an SMP junction, bus lines, probe pins etc. When the first circuit structure 31 sends RF, analog, digital, power or other types of signal to the electrical connector 35, the electrical connector 35 transfers these signals to an electronic device, such as a circuit board and a testing machine.

The second circuit structure 32 is detachably disposed on the handler 22 and electrically connected to the device under test 9.

In an embodiment, the second circuit structure 32 is a circuit board, such as a substrate having a core layer or a coreless substrate, and comprises a dielectric material and at least one circuit layer 32a bonded to the dielectric material, such as a fan-out RDL. In another embodiment, the second circuit structure 32 is a lead frame.

The second circuit structure 32 is screwed (e.g., via a screw 52 made of metal or an insulation material) with the handler 22.

The supporting part 33 is detachably disposed on the second circuit structure 32 and loosely fitted to the second side 30b of the carrier 30.

In an embodiment, the supporting part 33 is a non-metal material board made of a dielectric material, for example, and is engaged with the carrier 30. In another embodiment, the supporting part 33 has a convex portion 330 that acts as a leading pin, and the carrier 30 has a concave portion 302 disposed on the second side 30b and corresponding to the convex portion 330, as shown in FIG. 4. When the convex portion 330 is engaged with the concave portion 302, the supporting part 33 is positioned on the carrier 30 and completes an X-Y-Z 3D positioning with respect to the groove 300.

The supporting part 33 is screwed (e.g., via a screw 53 made of metal or an insulation material) with the second circuit structure 32.

A plurality of conductors 36 are disposed in the supporting part 33 and electrically connected to the second circuit structure 32. The second circuit structure 32 is electrically connected via the conductor 36 to the device under test 9. In an embodiment, the conductor 36 has a probe structure, such as a pogo pin, a bullet, a dual-head pin etc., and can move up and down elastically with respect to the supporting part 33. In an embodiment, the conductor 36 can elastically passes through the supporting part 33, with one end of the conductor 36 in contact with the circuit layer 32a of the second circuit structure 32 and the other end in communication with contacts of the device under test 9.

During use of the inspection equipment 2, the handler 22 and the supporting part 33 are located away from the second side 30b of the carrier 30 in the beginning, as shown in FIG. 4; a sucking disc of another robotic arm 23b sucks and places the device under test 9 in the groove 300 of the carrier 30; and then the displacement device 23 drives the handler 22 to compress the supporting part 33 downward to approach to the second side 30b of the carrier 30 (e.g., a downward motion shown in FIG. 3), allowing the conductive element 34 to be in close contact with the circuit layer 32a of the second circuit structure 32, to complete an effective electrical connection operation. An antenna inspection operation can be conducted subsequently.

When the handler 22 compresses downward, the conductive element 34 passes through the supporting part 33 and is electrically connected to the second circuit structure 32.

When the antenna inspection operation is conducted, the antenna structure 90 of the device under test 9 senses signals of the active surface 20a of the chamber 20 via the functioning hole 301, the through hole 310 and the passing hole 210, and sends the sensed signals via the conductor 36, the second circuit structure 32 and the conductive element 34 to the first circuit structure 31, and the electrical connector 35 transfers the sensed signals to an electronic device, such as a circuit board or a testing machine.

In the inspection equipment 2 according to the present disclosure, the testing device 3 has a detachable design, and boards such as the carrier 30, the first circuit structure 31, the second circuit structure 32 and the supporting part 33 can be detachably assembled by screws. When different antenna structures 90 are tested, only one or some of the carrier 30, the first circuit structure 31, the second circuit structure 32 and the supporting part 33 are to be changed, without replacing the whole testing device 3, thereby modular replacing and cost saving can be achieved. Compared with the prior art, the inspection equipment 2 according to the present disclosure can test different antenna structures 90 with a single aspect of handler 22, without customizing the handler 22. Therefore, the inspection equipment 2 has a reduced cost.

The carrier 30 is made of a low Df and Dk non-metal material, the antenna radiation signals (e.g., electromagnetic waves) will not be interfered severely, and a metal shield effect is avoided.

The foregoing descriptions of the detailed embodiments are only illustrated to disclose the features and functions of the present disclosure and not restrictive of the scope of the present disclosure. It should be understood to those in the art that all modifications and variations according to the spirit and principle in the disclosure of the present disclosure should fall within the scope of the appended claims.

What is claimed is:

1. A testing device, comprising:
   a carrier having a first side and a second side opposing the first side, wherein the carrier comprises a groove formed on the second side and a functioning hole formed on the first side and being in communication with the groove;
   a conductive element disposed in the carrier and being in communication with the first side and the second side;
   a first circuit structure detachably disposed on the first side of the carrier and electrically connected to the conductive element;
   a supporting part loosely fitted to the second side of the carrier; and
   a second circuit structure detachably disposed on the supporting part and electrically connected to the conductive element.

2. The testing device of claim 1, wherein the first circuit structure comprises a through hole corresponding to the functioning hole.

3. The testing device of claim 1, wherein at least one of the carrier and the supporting part is made of a non-metal material.

4. The testing device of claim 1, wherein the conductive element has a probe structure.

5. The testing device of claim 1, wherein the conductive element passes through the supporting part and is electrically connected to the second circuit structure.

6. The testing device of claim 1, wherein the first circuit structure is screwed with the carrier.

7. The testing device of claim 1, wherein the second circuit structure is screwed with the supporting part.

8. The testing device of claim 1, wherein the supporting part is engaged with the carrier.

9. The testing device of claim 1, wherein the supporting part comprises a conductor electrically connected to the second circuit structure.

10. The testing device of claim 9, wherein the conductor has a probe structure.

11. The testing device of claim 1, further comprising an electrical connector disposed on the first circuit structure and electrically connected to the first circuit structure.

12. An inspection equipment, comprising:
   a chamber having an opening;
   a cover covering the opening of the chamber;
   the testing device of claim 1 disposed on the cover via the first circuit structure; and
   an handler disposed on the second circuit structure of the testing device.

13. The inspection equipment of claim 12, wherein the first circuit structure is detachably disposed on the cover.

14. The inspection equipment of claim 12, wherein the handler is detachably disposed on the second circuit structure.

15. The inspection equipment of claim 12, wherein the cover comprises a passing hole, and the carrier is exposed from the passing hole.

16. The inspection equipment of claim 12, further comprising a displacement device fixed to the handler.

17. The inspection equipment of claim 16, wherein the displacement device comprises at least one robotic arm.

18. The inspection equipment of claim 12, wherein the chamber comprises a metal material.

* * * * *